United States Patent [19]

Chan

[11] Patent Number: 4,954,851
[45] Date of Patent: Sep. 4, 1990

[54] SCHOTTKY BARRIER ON INDIUM GALLIUM ARSENIDE

[75] Inventor: Winston K. Chan, Fair Haven, N.J.

[73] Assignee: Bell Communications Research Inc., Livingston, N.J.

[21] Appl. No.: 199,171

[22] Filed: May 26, 1988

[51] Int. Cl.$^5$ .......................................... H01L 29/48
[52] U.S. Cl. ...................................... 357/15; 357/16; 357/22; 357/67
[58] Field of Search ..................... 357/15, 67, 10, 16, 357/22 A, 22 I, 67

[56] References Cited

U.S. PATENT DOCUMENTS

| | | | |
|---|---|---|---|
| 4,292,461 | 9/1981 | Hovel | 357/2 |
| 4,608,586 | 8/1986 | Kim | 357/16 |
| 4,830,986 | 5/1989 | Plumb | 357/16 |

FOREIGN PATENT DOCUMENTS 62-234369 10/1987 Japan ..................................... 357/71

OTHER PUBLICATIONS

"Microwave Performance of InAlAs/InGaAs/InP Modeet's", C. K. Peng et al., IEEE Electron Device Letters, vol. Edl-8, No. 1, pp. 24-26, Jan. 1987.

"An Applied Science Perspective of Langmuir-Blodgett Films", G. G. Roberts, Advances in Physics, vol. 34, No. 4, pp. 475-512, 1985.

"Langmuir-Blodgett Deposited Cadmium Gate Inverted InP-GaInAs Modulation Doped Field Effect Transistors", W. K. Chan et al., Electronics Letters vol. 23, No. 25, pp. 1346-1348, Dec. 3, 1987.

"Junction Field Effect Transistors Using In0.53Ga0.47As Material Grown by Molecular Beam Epitaxy", T. Y. Chang et al., IEEE Electron Device Letters, vol. Edl-3, No. 3, pp. 56-58, Mar. 1982.

"Self-Aligned-Gate GaInAs Microwave Misfet's", P. D. Gardner et al., IEEE Electron Device Letters, vol., Edl-7, No. 6, pp. 363-365, Jun. 1986.

"700 mS/mm 2Degfets Fabricated from High Mobility MBE-Grown n-AlInAs/GaInAs Heterostructures", K. Hirose et al., Proceedings of the International Symposium on GaAs and Related Compounds, pp. 529-534, 1985.

"Schottky Barrier Heights of Hg, Cd, and Zn on n-Type InP(100)", C. J. Sa and L. G. Meiners, Appl. Phys. Lett. 48 (26), pp. 1796-1798, June 30, 1986.

"InP Metal Semiconductor Field Effect Transistors with Mercury and Cadmium Gates", L. G. Meiners, Appl. Phys. Lett. 49 (6), pp. 340-341, Aug. 11, 1986.

"Vapor Levitation Epitaxy: System Design and Performance", H. M. Cox et al., Journal of Crystal Growth, vol. 79, pp. 900-908, 1986.

"Comparison of the Saturated Current in Normal and Inverted Modulation Doped In0.53Ga0.47As/InP Structures", W. K. Chan et al., IEEE Electron Device Letters, vol. Edl-6, No. 5, pp. 247-249, May 1985.

"Schottky Barrier Height of n-InxGa1-xAs Diodes", K. Kajiyama et al., Appl. Phys. Lett., vol. 23, No. 8, pp. 458-459, Oct. 15, 1973.

"Control of Schottky Barrier Height Using Highly Doped Surface Layers", J. M. Shannon, Solid-State Electronics, vol. 19, pp. 537-543, 1973.

"Increase of Schottky Barrier Height at GaAs Surfaces by Carboxylic Acid Monolayers and Multilayers", R. H. Tredgold et al., J. Phys. D, 18, pp. 103-109, 1985.

"InGaAs Metal Semiconductor Field Effect Transistor with Langmuir-Blodgett Deposited Gate Structure", W. K. Chan et al., IEEE Electron Device Letters, vol. 9, No. 5, May 1988.

Primary Examiner—Andrew J. James
Assistant Examiner—Courtney A. Bowers
Attorney, Agent, or Firm—James W. Falk

[57] ABSTRACT

The formation on an indium gallium arsenide substrate of a cadmium-containing layer significantly enhances the Schottky-barrier height between an overlying metal and the substrate. Device structures such as gates for indium gallium arsenide field-effect transistors are thereby made feasible.

3 Claims, 1 Drawing Sheet

SCHOTTKY BARRIER ON INDIUM GALLIUM ARSENIDE

BACKGROUND OF THE INVENTION

This invention relates to semiconductor fabrication techniques and, more particularly, to compound semiconductor devices.

It is well known that the compound semiconductor indium gallium arsenide has excellent properties that make it an attractive candidate for use in making high-speed electronic devices such as field-effect transistors (FETs). Moreover, since this semiconductor can be lattice matched to indium phosphide, it is also known that indium gallium arsenide is of practical importance for making opto-electronic integrated devices operating in the wavelength range where optical fiber loss and dispersiion are low.

The main problem that has stood in the way of widespread use of indium gallium arsenide to make microminiature FET devices is the unavailability of a suitable gate technology for this material. For example, in a metal-insulator-semiconductor FET (MISFET) in which a dielectric such as silicon dioxide overlies the indium gallium arsenide, a high and deleterious density of interface states is typically encountered. Also, in a pn-junction gate FET (JFET), it is difficult in practice to make a pn-junction gate that is one micrometer or less in length.

Schottky-barrier (SB) gate technology represents the simplest approach for making FET devices. But attempts to fabricate such metal-semiconductor FETs (MESFETs) in n-type indium gallium arsenide have heretofore not been satisfactory. This is due primarily to the relatively low-bandgap property of this semiconductor. This causes the SB height between an overlying metal and indium gallium arsenide to be so low as to result in unacceptably leaky gates.

Recently work has been reported on using an epitaxial layer of aluminum indium arsenide between the gate metal and indium gallium arsenide to enhance the SB height in a MESFET device, as described by C. K. Peng et al, "Microwave Performance of InAlAs/InGaAs/InP MODFETS", *IEEE Electron, Device Lett.*, 1987, EDL-8, pp. 24–26. But this extra epitaxial layer makes it difficult to obtain extremely low-resistance source and drain contacts and makes the FET structure more difficult to integrate with optical devices.

Accordingly, continuing efforts have been directed by workers skilled in the art aimed at trying to devise other ways of increasing the SB height of metal-to-indium gallium arsenide devices. It was recognized that these efforts, if successful, had the potential for enhancing the attractiveness of this compound semiconductor material for use in making practical devices of commercial importance such as FETs and opto-electronic integrated devices.

SUMMARY OF THE INVENTION

In accordance with the principles of the present invention, the SB height of a device that includes an indium gallium arsenide substrate is enhanced by interposing an insulating layer comprising cadmium between an overlying metal and the surface of the indium gallium arsenide. The insulating layer is formed by initially depositing a cadmium compound that includes organic constituents and then subjecting the deposited material to an oxygen plasma to remove all or most of the organic constituents. The resulting layer comprises oxides and/or carbonates of cadmium. A metal is then deposited over the cadmium-containing layer. As a result, the SB height between the metal and the spaced-apart underlying indium gallium arsenide is significantly increased over the SB height obtained in a direct metal-to-indium gallium arsenide contact.

In accordance with a feature of this invention, the initial cadmium compound comprises cadmium di-stearate which is deposited on indium gallium arsenide by Langmuir-Blodgett techniques to form a layer having a precisely specified thickness. After treatment in an oxygen plasma, portions of the resulting cadmium-containing layer are patterned to constitute small-feature-size elements of a semiconductor device. In one particular embodiment, each of these elements serves as an SB enhancement layer in a metal-insulating layer-indium gallium arsenide gate structure of an FET device.

In accordance with a particular feature of this invention, the fabrication of microminiature elements of a semiconductor device includes forming a layer on the surface of a semiconductor in a Langmuir-Blodgett deposition step.

BRIEF DESCRIPTION OF THE DRAWING

A complete understanding of the present invention and of the above and other features and advantages thereof may be gained from a consideration of the following detailed description presented hereinbelow in connection with the accompanying drawing, not drawn to scale, in which.

DETAILED DESCRIPTION

Figure 1:
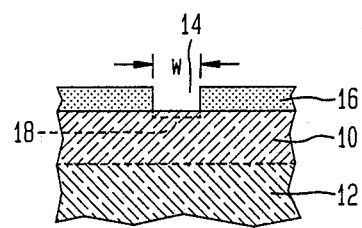
FIGS. 1 and 2 show successive illustrative stages in the formation of a cadmium-containing layer on a lithographically defined portion of an indium gallium arsenide substrate in accordance with the principles of the present invention.

FIG. 1 shows a portion of an indium gallium arsenide substrate 10. Illustratively, the substrate 10 comprises an n-type epitaxial layer of a multi-layered semiconductor device. By way of a specific example, the substrate 10 is grown on an underlying epitaxial layer 12 made of indium phosphide. In that case, it is advantageous to form the substrate 10 to be $In_{0.53}Ga_{0.47}As$, which compound is lattice matched to the underlying indium phosphide. In one specific illustrative modulation-doped field-effect-transistor device including such lattice-matched layers, the doping of the $In_{0.53}Ga_{0.47}As$ substrate 10 was about $10^{15}$ cm$^{-3}$ and the thickness of the substrate 10 was approximately 200 nanometers (nm).

In accordance with the principles of the present invention, all but prescribed portions of the surface of the substrate 10 are masked. This is done, for example, by conventional lithographic patterning techiniques. Thus, as shown in FIG. 1, all but a narrow channel portion 14 of the surface of the substrate 10 is covered with a layer 16 of photoresist. In one specific illustrative example in which a microminiature gate structure of an FET device is to be formed on the surface of the substrate 10, the width w of the channel 14 is only approximately one micrometer (μm).

For current-limiting purposes in an FET device, it is advantageous to etch the unmasked surface (the gate-structure portion) of the substrate 10 shown in FIG. 1. Such etching can be done, for example, using a solution of 1:1:38 $H_3PO_4:H_2O_2:H_2O$. In FIG. 1, the recess formed in the substrate 10 by such etching is outlined by dash line 18.

Figure 2:
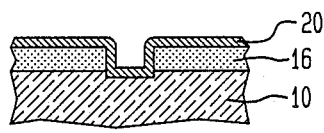

In accordance with the principles of the present invention, the entire surface of the herein-described structure is then covered with a layer 20 (FIG. 2 of a material that includes cadmium and organic constituents that facilitate deposition. In accordance with a particular feature of this invention, the layer 20 is advantageously formed by utilizing a procedure known as the Langmuir-Blodgett deposition technique. This technique is described in detail by G. G. Roberts in "An Applied Science Perspective of Langmuir-Blodgett Films", *Adv. Phys.*, 1985, 34, pp. 475–512.

Surprisingly, in accordance with a feature of this invention, the known Langmuir-Blodgett technique was discovered to be effective in consistently covering the surfaces of micron-size openings such as the channel 14 (FIG. 1). That discovery has revealed the applicability of the Langmuir-Blodgett technique for making practical semiconductor devices. In particular, the technique has been found to be applicable to the fabrication of microminiature devices of the type that require deposition of extremely small and controlled amounts of prescribed materials. Importantly, the technique has been found to be compatible with standard III-V processing technology.

In accordance with a specific illustrative example of the principles of this invention, successive layers of cadmium di-stearate are deposited on the entire exposed surface of the FIG. 1 structure by the aforementioned Langmuir-Blodgett technique. Illustratively, this is done by repeatedly dipping the structure in a Langmuir-Blodgett trough that contains a buffered aqueous solution of $2.5 \times 10^{-4}$ mole/liter cadmium chloride and a surface film of stearic acid held at a surface pressure of about 30 millinewton/meter. With each dip, two monolayers of cadmium di-stearate are deposited, one on entering the trough and another on exiting it. By way of example, each such deposited layer is about 2.5 nm thick. Thus, by depositing 100 successive layers (50 dips), the resulting thickness of the layer 20 (FIG. 2) is approximately 0.25 μm. The uniformity-of-coverage and adhesion of this layer to underlying surfaces of the substrate 10 were judged to be satisfactory for device purposes.

Next, in accordance with the principles of this invention, the deposited layer 20 of FIG. 2 is processed to remove organic constituents therefrom. This is done, for example, by subjecting the layer 20 to an oxygen plasma. Illustratively, the layer 20 is exposed for about one minute to a radio-frequency (30 Kilohertz) plasma formed from pure oxygen at a pressure of about 200 milliTorr and at a power density of approximately 200 milliwatts per square centimeter. As a result, the layer 20 is converted to a cadmium-containing dielectric material that includes oxides and/or carbonates of cadmium. The converted layer resists etching by the plasma. This converted layer constitutes the SB enhancement layer of the present invention.

The converted layer 20 is then covered with a layer 22 made of metal. Advantageously, aluminum, which does not form any intermetallic compounds with cadmium below the melting point of cadmium, is thermally evaporated to form the layer 22.

Figure 3:
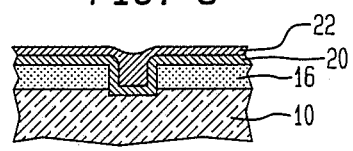
FIG. 3 depicts a metallic layer overlying the cadmium-containing layer.

Subsequently, in a standard lift-off step, the photoresist layer 16 is dissolved in a solvent and thereby removed from the FIG. 3 structure. As a consequence, the portions of the layers 20 and 22 that overlie the photoresist layer 16 are also thereby removed.

Figure 4:
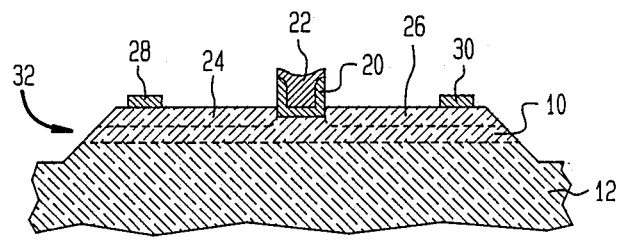
FIG. 4 schematically shows a specific illustrative FET device that includes a gate structure made in accordance with the fabrication sequence represented in FIGS. 1 through 3.

The portions of the layers 20 and 22 that remain after lift-off are shown in FIG. 4. These portions constitute the Schottky-barrier gate structure of a specific illustrative FET device. Conventional ohmic contacts 28 and 30 are formed on the substrate 10 overlying standard source and drain regions 24 and 26. For isolation purposes, the FET device shown in FIG. 4 is advantageously fabricated in a raised or mesa portion 32 of the indium gallium arsenide substrate 10.

The layer 20 described herein is effective to significantly enhance the barrier height of SB metal-to-indium gallium arsenide contacts. In one particular case in which the cadmium-containing layer 20 including 100 monolayers formed by Langmuir-Blodgett deposition, the SB height of the resulting contact was determined, by measuring the forward current/voltage characteristic, to be 0.52 electron volts. By comparison, direct deposition of the metal on $In_{0.53}Ga_{0.47}As$, without the presence of a cadmium-containing enhancement layer of the type specified herein, formed only a 0.2 electron-volt-high SB contact.

The SB enhancement layers specified herein are useful for fabricating indium gallium arsenide FET devices. But, in accordance with the principles of the present invention, these layers can also be employed to fabricate a variety of SB indium gallium arsenide devices of the opto-electronic type, such as photodetectors.

In accordance with the principles of this invention, advantageous ways of depositing cadmium to form elements of microminiature semiconductor devices have been described. This is significant because cadmium is usually a difficult material to vacuum deposit, due to its high vapor pressure, toxicity and tendency to ball up. Further, the other common method of depositing cadmium, namely, electroplating, is not usually suitable in practice for making microminiature devices.

Moreover, the techniques described herein are capable of providing a deposited layer characterized by a relatively low surface concentration of cadmium. Such a layer is useful as a diffusion source for making shallow junctions in a semiconductor device.

Finally, it is to be understood that the above-described techniques and structures are only illustrative of the principles of the present invention. In accordance with these principles, numerous modifications and alternatives may be devised by those skilled in the art without departing from the spirit and scope of the invention.

What is claimed is:

1. A semiconductor device comprising
    a substrate comprising indium gallium arsenide,
    a cadmium-containing layer on said substrate,
    and a conductive layer overlying said cadmium-containing layer to form a Schottky-barrier contact with said substrate,
    wherein said substrate comprises an epitaxial layer of $In_{0.53}Ga_{0.47}As$,
    wherein said epitaxial layer of $In_{0.53}Ga_{0.47}As$ overlies an epitaxial layer comprising indium phosphide, and wherein said cadmium-containing layer constitutes a dielectric selected from the group consisting of oxides and carbonates of cadmium.

2. A device as in claim 1 wherein said cadmium-containing layer and said overlying conductive layer comprise the gate of a field-effect-transistor structure.

3. A device as in claim 2 wherein said conductive layer comprises aluminum.

* * * * *